US012245721B2

United States Patent
Prestileo et al.

(10) Patent No.: US 12,245,721 B2
(45) Date of Patent: Mar. 11, 2025

(54) METHOD FOR CREATING A DIGITAL TWIN OF A BEVERAGE DISPENSER

(71) Applicant: CELLI S.P.A., Rimini (IT)

(72) Inventors: Andrea Prestileo, Rimini (IT); Fabrizio Faraci, Rimini (IT); Roberto Castelli, Rimini (IT); Cesare Schiatti, Rimini (IT)

(73) Assignee: CELLI S.P.A., Rimini (IT)

( * ) Notice: Subject to any disclaimer, the term of this patent is extended or adjusted under 35 U.S.C. 154(b) by 253 days.

(21) Appl. No.: 18/147,320

(22) Filed: Dec. 28, 2022

(65) Prior Publication Data

US 2023/0210302 A1 Jul. 6, 2023

(30) Foreign Application Priority Data

Dec. 30, 2021 (IT) .................. 102021000033131

(51) Int. Cl.
*A47J 31/52* (2006.01)
*A47J 31/46* (2006.01)
*G06F 30/20* (2020.01)
*G06K 19/07* (2006.01)

(52) U.S. Cl.
CPC ........... *A47J 31/521* (2018.08); *A47J 31/461* (2018.08); *G06F 30/20* (2020.01); *G06K 19/0723* (2013.01)

(58) Field of Classification Search
CPC ....... A47J 31/521; A47J 31/461; G06F 30/20; G06F 8/71; G06F 9/54; G06K 19/0723; B67D 1/0888
See application file for complete search history.

(56) References Cited

U.S. PATENT DOCUMENTS

| 7,611,052 B2 * | 11/2009 | Gosi ..................... G07F 13/025 |
| | | 235/383 |
| 2005/0087255 A1 * | 4/2005 | Humphrey .............. G07F 7/025 |
| | | 141/94 |

(Continued)

FOREIGN PATENT DOCUMENTS

| EP | 3248933 A1 | 11/2017 |
| WO | WO 2021/211798 A1 | 10/2021 |

OTHER PUBLICATIONS

Italian Search Report received in Italian Application No. 102021000033128 dated Aug. 3, 2022 in 13 pages.

*Primary Examiner* — Donnell A Long
(74) *Attorney, Agent, or Firm* — Maier & Maier, PLLC

(57) ABSTRACT

A method for creating a digital twin of a beverage dispenser including first and second tapping valves is based on the use of a telematic communication network with a cloud server provided with storage in which one or more geographical areas are stored and for each geographical area one or more respective sites in which at least one beverage dispenser is positioned, as well as a plurality of beverages. The digital twin is created based on data stored in the storage: a datum concerning a selected geographical area and/or a datum concerning a selected site, a datum concerning a first unique identification code associated with the first tapping valve, a datum concerning a second unique identification code associated with the second tapping valve, a datum concerning a first beverage associated with the first tapping valve, and a datum concerning a second beverage associated with the second tapping valve.

13 Claims, 3 Drawing Sheets

(56) References Cited

U.S. PATENT DOCUMENTS

| | | | |
|---|---|---|---|
| 2010/0125362 A1* | 5/2010 | Canora | G06Q 20/327 235/487 |
| 2011/0168775 A1* | 7/2011 | Van Zetten | B67D 1/0888 222/129 |
| 2012/0035761 A1* | 2/2012 | Tilton | B67D 1/0057 700/239 |
| 2013/0085874 A1* | 4/2013 | Gagne | G07F 9/023 99/290 |
| 2013/0231774 A1* | 9/2013 | Tilton | G07F 13/065 700/239 |
| 2014/0319167 A1* | 10/2014 | Dorney | G06Q 20/342 222/1 |
| 2019/0012498 A1 | 1/2019 | Mahncke | |
| 2019/0287089 A1* | 9/2019 | Mahncke | G07F 9/001 |
| 2020/0249660 A1 | 8/2020 | Rao et al. | |
| 2021/0221667 A1 | 7/2021 | Venkatakrishanan et al. | |
| 2023/0215239 A1* | 7/2023 | Paterson | G07F 13/065 700/237 |

\* cited by examiner

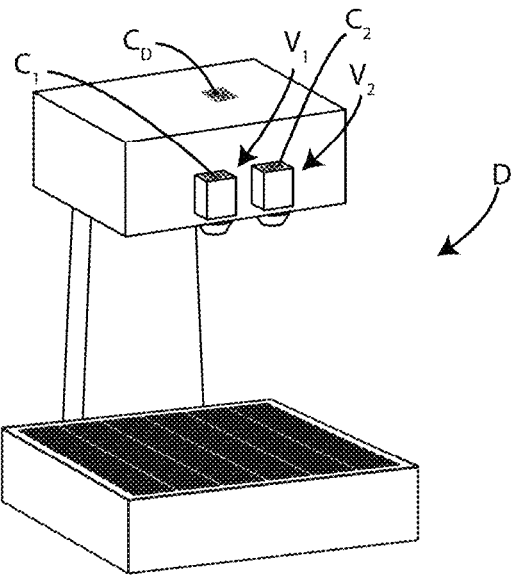
FIG. 1
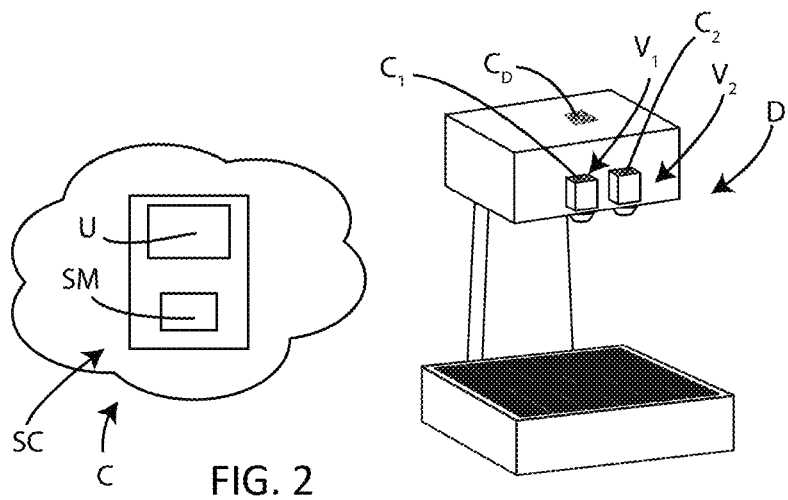
FIG. 2
| Geographical area | Site |
|---|---|
| $A_1$ | $S_{11}, S_{12} ... S_{1M}$ |
| $A_2$ | $S_{21}, S_{22} ... S_{2M}$ |
| ... | ... |
| $A_N$ | $S_{N1}, S_{N2} ... S_{NM}$ |
FIG. 3

METHOD FOR CREATING A DIGITAL TWIN OF A BEVERAGE DISPENSER

CROSS-REFERENCE TO RELATED APPLICATIONS

This application claims priority to Italian Patent Application No. 102021000033131, filed on Dec. 30, 2021, which is incorporated herein by reference in its entirety.

TECHNICAL FIELD

The present disclosure relates a method for creating a digital twin of a beverage dispenser.

In particular, the disclosure relates to a method for creating a digital twin of a beverage dispenser provided with one or more tapping valves for dispensing a respective beverage, so that an operator can remotely control the tapping valves of the beverage dispenser through the digital twin of the beverage dispenser.

The term "beverage" means any beverage, such as a carbonated beverage or a soft drink or a beer.

The expression "digital twin" means a virtual representation of a physical entity or a process.

The physical entity can be any object, such as a beverage dispenser.

The expression "controlling a tapping valve" means the possibility of giving a command to a tapping valve and/or the possibility of controlling a set of parameters associated with said tapping valve, for example to modify one or more parameters of said set of parameters and/or add one or more further parameters to said set of parameters.

The digital twin of a beverage dispenser is stored in a cloud server and an operator can remotely access said cloud server to issue a command to one or more tapping valves of the beverage dispenser and/or control a respective set of parameters associated to one or more tapping valves and/or add one or more further parameters to said set of parameters.

In the following description, reference will be made to the digital twin of a beverage dispenser provided with two tapping valves.

However, with the same advantages, the method can be designed to create a digital twin of a beverage dispenser with more than two tapping valves.

BACKGROUND

It is currently known that a beverage dispenser can be provided with one or more tapping valves.

A tapping valve is designed to dispense a beverage manually or automatically.

The beverage dispensers are positioned in sites located in many geographical areas of the world.

One or more beverage dispensers can be located on the same site and multiple sites can be present within the same geographical area.

The control of the tapping valves is performed by operators who reach the various sites where said beverage dispensers are positioned.

In general, if you consider a nation as a geographic area, each nation will need a certain number of operators based on the number of beverage dispensers.

A disadvantage is given by the fact that the presence of an operator within the site is necessary to control the tapping valves of one or more beverage dispensers positioned in said site.

A further disadvantage is given by the fact that it is necessary to train a certain number of operators based on the number of geographical areas and the number of beverage dispensers positioned on the sites of said geographical areas in order for said operators to guarantee the control and operation of said beverage dispensers.

Such geographic areas are often distant from each other and sometimes even sites within the same geographic area can be distant from each other.

Consequently, the number of operators must be such as to guarantee coverage of the territory of each geographical area where there are sites provided with beverage dispensers.

SUMMARY

It is an aim of the disclosure to overcome said disadvantages providing a method for creating a digital twin of a beverage dispenser for controlling one or more tapping valve included in said beverage dispenser.

Advantageously, the digital twin of a physical entity, wherein said physical entity is a beverage dispenser comprising a plurality of tapping valves, allows a remote operator to control the tapping valves of the beverage dispenser through the digital twin of the beverage dispenser.

The control of a tapping valve is performed through an action that the tapping valve must perform or by changing the parameters of a set of parameters associated with the tapping valve or by adding one or more parameters to said set of parameters.

The possibility of intervening on the digital twin of a beverage dispenser in order to intervene on one or more tapping valves of said beverage dispenser allows an operator not to be present in the place where the beverage dispenser is positioned.

Consequently, any action performed by the operator on the digital twin of the beverage dispenser is an action performed on the beverage dispenser that is positioned at a site within a geographic area.

It is therefore object of some embodiments of the present disclosure a method for creating a digital twin of a beverage dispenser, wherein said beverage dispenser is of the type comprising at least one first tapping valve and a second tapping valve, wherein a first unique recognition element is associated with said first tapping valve and a second unique recognition element is associated with said second tapping valve, wherein said method comprises the following steps:

A) providing a telematics (or telematic) communication network comprising a cloud server provided with storage means wherein the following data are stored: one or more geographical areas, for each geographical area one or more respective sites in which at least a beverage dispenser is placed, and a plurality of beverages, different from each other;

B) selecting a geographical area between the geographical areas stored in said storage means and/or a site between the sites stored in said storage means associated with the selected geographical area, and storing in said storage means a data concerning said selected geographical area and/or a data concerning said selected site;

C) acquiring at least one first unique identification code associated with said first tapping valve through said first unique recognition element;

D) storing in said storage means a data concerning said at least one first unique identification code;

E) acquiring at least one second unique identification code associated with said second tapping valve through said second unique recognition element;
F) storing in said storage means a data concerning said at least one second unique identification code;
G) selecting a first beverage between said plurality of beverages;
H) associating said first beverage with said first tapping valve and storing in said storage means a data concerning said first beverage associated with said first tapping valve;
I) selecting a second beverage between said plurality of beverages;
L) associating said second beverage with said second tapping valve and storing in said storage means a data concerning said second beverage associated with said second tapping valve; and
M) creating a digital twin of said beverage dispenser through a data group stored in said storage means, wherein said data group comprises: a data concerning said selected geographical area and/or a data concerning said selected site, a data concerning said at least one a first unique identification code associated with said first tapping valve, a data concerning said at least one second unique identification code associated with said second tapping valve, and a data concerning said first beverage associated with said first tapping valve, and a data concerning said second beverage associated with said second tapping valve.

Preferred embodiments are disclosed in the dependent claims.

BRIEF DESCRIPTION OF THE DRAWINGS

The present disclosure will be now described, for illustrative, but not limitative purposes, according to its embodiments, making particular reference to the enclosed figures, wherein:

FIG. 1 shows a beverage dispenser provided with two tapping valves;

FIG. 2 shows a telematic communication network and the beverage dispenser of FIG. 1;

FIG. 3 shows a table in which a respective plurality of sites, in which a beverage dispenser is present, is associated with a respective geographical area;

In the various figures, similar parts will be indicated with the same reference numbers.

DETAILED DESCRIPTION

With reference to FIG. 1, such a Figure shows a beverage dispenser indicated with the reference D.

In the embodiment being disclosed, the beverage dispenser D is provided with a first tapping valve $V_1$ for dispensing a first beverage and a second tapping valve $V_2$ for dispensing a second beverage.

Each beverage can be a single liquid or can be formed by a mix of two liquids different from each other.

For dispensing a beverage formed by a mix of two liquids, the tapping valve is provided with a first line or first channel for the passage of the first liquid and a second line or second channel for the passage of the second liquid.

The first tapping valve $V_1$ is provided of a first unique recognition element $C_1$ and the second tapping valve $V_2$ is provided with a second unique recognition element $C_2$.

In the example being disclosed, said first unique recognition element $C_1$ is a first QR code and said second unique recognition element $C_2$ is a second QR code.

The first tapping valve $V_1$ has an outer surface and said first QR code $C_1$ is applied on a portion of said outer surface.

The second tapping valve $V_2$ has an outer surface and said second QR code $C_2$ is applied on a portion of said outer surface.

In other words, the first QR code $C_1$ is associated with the first tapping valve $V_1$ and the second QR code $C_2$ is associated with the second tapping valve $V_2$.

The first QR code $C_1$ contains at least one first unique identification code associated with the first tapping valve The second QR code $C_2$ contains at least one second unique identification code associated with the second tapping valve $V_2$.

However, although not shown in Figures, said first unique recognition element $C_1$ can be a first RFID tag and said second unique recognition element $C_2$ can be a second RFID tag.

FIG. 2 shows a telematic communication network C and a beverage dispenser D.

Said telematic communication network C comprises a cloud server SC comprising storage means SM.

At least the following data are stored in said storage means SM:
one or more geographical areas $A_1, A_2 \ldots A_N$,
one or more respective sites $S_{11}, S_{12} \ldots S_{1M}; S_{21}, S_{22} \ldots S_{2M}; S_{N1}, S_{N2} \ldots S_{NM}$ for each geographical area $A_1, A_2 \ldots A_N$, in which at least a beverage dispenser D is placed, and
a plurality of beverages $B_1, B_2 \ldots B_j$;

FIG. 3 is a table showing for each geographical area $A_1, A_2 \ldots A_N$ stored in the storage means SM the respective sites $S_{11}, S_{12} \ldots S_{1M}; S_{21}, S_{22} \ldots S_{2M} \ldots S_{N1}, S_{N2} \ldots S_{NM}$ in which at least one a beverage dispenser D.

In the example being disclosed, the beverage dispenser D is placed in a first site $S_{11}$ present within a first geographical area $A_1$.

Figure 4:
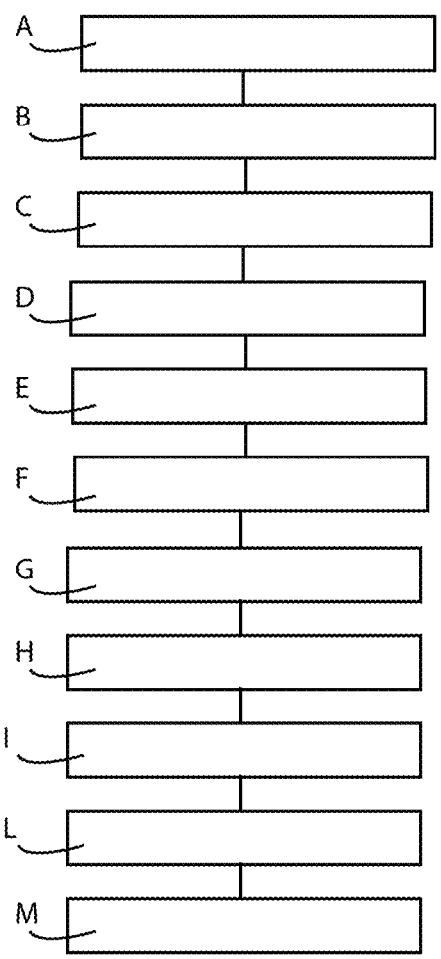
FIG. 4 shows the flowchart of the method for creating a digital twin of a beverage dispenser of FIG. 1.
Figure 5:
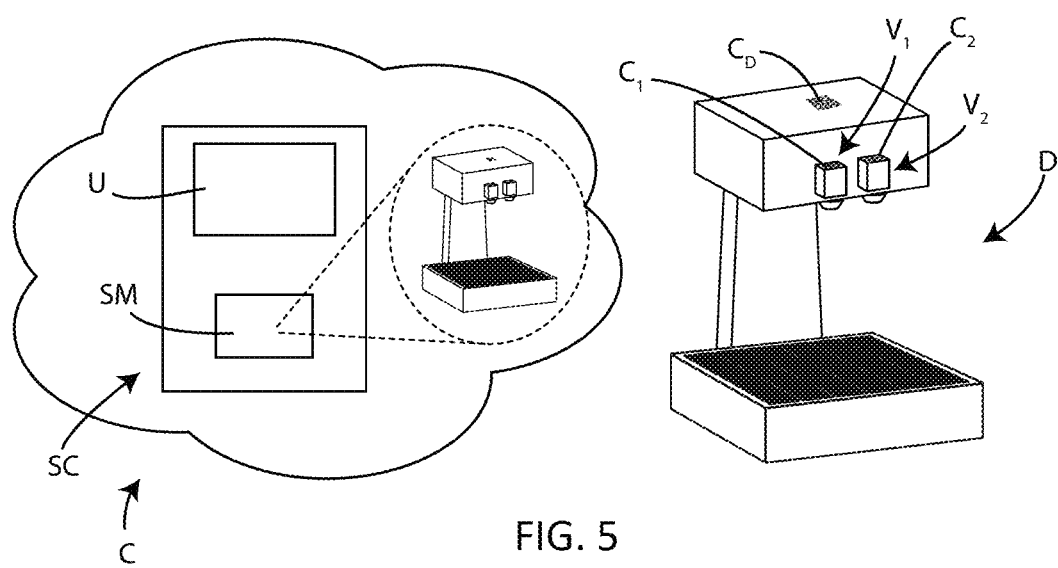
FIG. 5 shows a telematic communication network in which the digital twin of said beverage dispenser is stored and the beverage dispenser.
Figure 6:
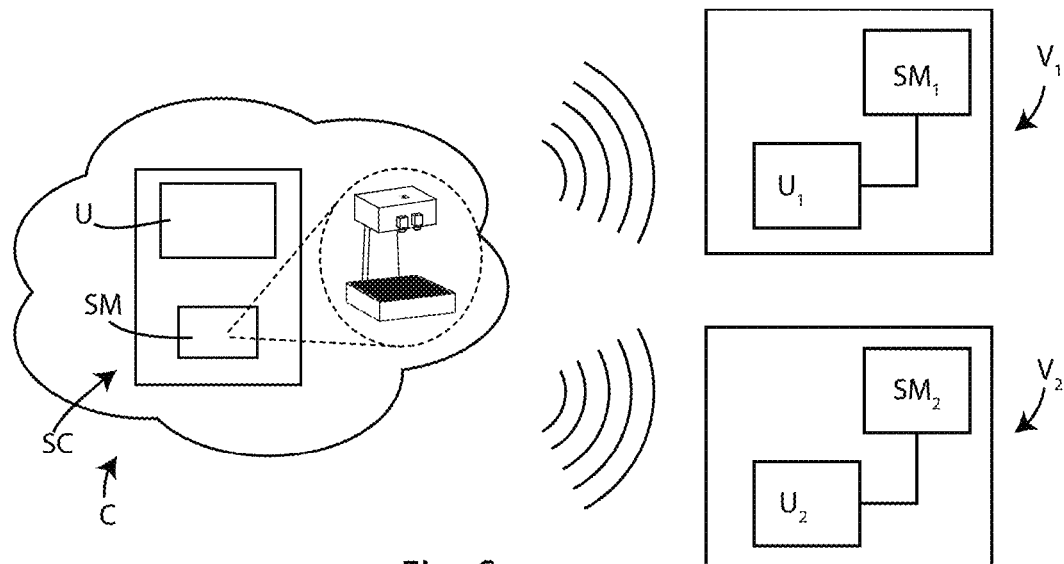
FIG. 6 shows a telematic communication network in which the digital twin of said beverage dispenser and the two tapping valves of the beverage dispenser are stored, in which the cloud server present in said communication network sends a respective signal to each tapping valve of the beverage dispenser.
Figure 7:
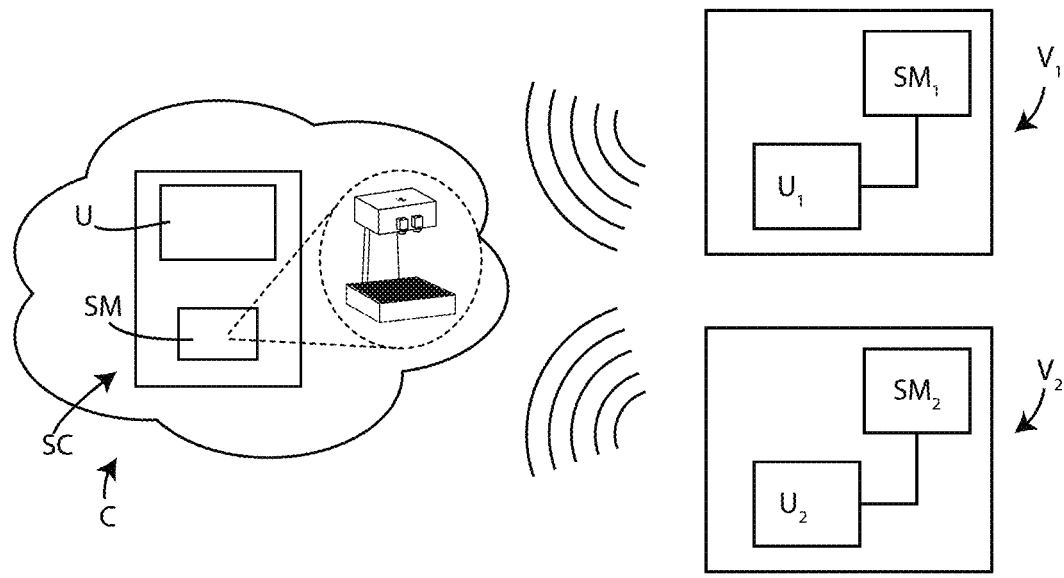
FIG. 7 shows a telematic communication network in which the digital twin of said beverage dispenser and the two tapping valves of the beverage dispenser are stored, in which the cloud server present in said communication network receives a respective signal from each tapping valve of the beverage dispenser.

FIG. 4 shows the flowchart of the method for creating a digital twin of said beverage dispenser D.

The method for creating a digital twin of a beverage dispenser D comprising the following steps:
A) providing a telematic communication network C comprising a cloud server SC provided with storage means SM wherein the following data are stored:
one or more geographical areas $A_1, A_2 \ldots A_N$ (wherein N is an integer positive number),
for each geographical area $A_1, A_2 \ldots A_N$ one or more respective sites $S_{11}, S_{12} \ldots S_{1M}; S_{21}, S_{22} \ldots S_{2M}; S_{N1}, S_{N2} \ldots S_{NM}$ (wherein M is an integer positive number) in which at least a beverage dispenser D is placed, and a plurality of beverages $B_1, B_2 \ldots B_J$, different from each other;

B) selecting:
a geographical area between the geographical areas $A_1, A_2 \ldots A_N$ stored in said storage means SM and/or a site between the sites $S_{11}, S_{12} \ldots S_{1M}, S_{21}, S_{22} \ldots S_{2M} \ldots S_{N1}, S_{N2} \ldots S_{NM}$ stored in said storage means SM associated with the selected geographical area, and storing in said storage means SM a data concerning said selected geographical area $A_1, A_2 \ldots A_N$ and/or a data concerning said selected site $S_{11}, S_{12} \ldots S_{1M}, S_{21}, S_{22} \ldots S_{2M}, \ldots S_{N1}, S_{N2} \ldots S_{NM}$;

C) acquiring at least one first unique identification code associated with said first tapping valve $V_1$ through said first unique recognition element D) storing in said storage means SM a data concerning said at least one first unique identification code;

E) acquiring at least one second unique identification code associated with said second tapping valve $V_2$ through said second unique recognition element $C_2$;

F) storing in said storage means SM a data concerning said at least one second unique identification code;

G) selecting a first beverage $B_1$ between said plurality of beverages $B_1, B_2 \ldots B_J$;

H) associating said first beverage $B_1$ with said first tapping valve $V_1$ and storing in said storage means SM a data concerning said first beverage $B_1$ associated with said first tapping valve $V_1$;

I) selecting a second beverage $B_2$ between said plurality of beverages $B_1, B_2 \ldots B_J$, L) associating said second beverage $B_2$ with said second tapping valve $V_2$ and storing in said storage means SM a data concerning said second beverage $B_2$ associated with said second tapping valve $V_2$; and M) creating a digital twin of said beverage dispenser D through a data group stored in said storage means SM, wherein said data group comprises:
a data concerning said selected geographical area $A_1, A_2 \ldots A_N$ and/or a data concerning said selected site $S_{11}, S_{12} \ldots S_{1M}, S_{21}, S_{22} \ldots S_{2M}; \ldots S_{N1}, S_{N2} \ldots S_{NM}$,
a data concerning said at least one a first unique identification code associated with said first tapping valve
a data concerning said at least one second unique identification code associated with said second tapping valve $V_2$,
a data concerning said first beverage $B_1$ associated with said first tapping valve $V_1$, and
a data concerning said second beverage $B_2$ associated with said second tapping valve $V_2$.

With reference to step A, the method requires the presence of a telematics communication network C.

Said telematic communication network C comprises a cloud server SC provided with storage means SM and a logic control unit U connected to said storage means SM.

In the example being disclosed, a plurality of geographical areas $A_1, A_2 \ldots A_N$ is stored in the storage means SM and, for each geographical area $A_1, A_2 \ldots A_N$ respective sites $S_{11}, S_{12} \ldots S_{1M}, S_{21}, S_{22} \ldots S_{2M}, \ldots S_{N1}, S_{N2} \ldots S_{NM}$ in which at least one beverage dispenser D is placed are stored.

Furthermore, a plurality of beverages $B_1, B_2 \ldots B_J$, different from each other, is stored in said storage means SM.

With reference to step B, a geographical area between the geographical areas $A_1, A_2 \ldots A_N$ stored in said storage means SM can be selected.

In combination or alternatively with the selected geographical area a site among the sites $S_{11}, S_{12} \ldots S_{1M}, S_{21}, S_{22} \ldots S_{2M} \ldots S_{N1}, S_{N2} \ldots S_{NM}$ stored in said storage means SM and associated with the selected geographical area can be selected.

Consequently, a data concerning the selected geographical area or a data concerning the selected site can be stored in said storage means SM of the cloud server SC or, alternatively, the data concerning the selected geographical area and the data concerning the site selected can be stored in said storage mean SM of the cloud server SM.

With reference to step C, the method provides the steps of acquiring at least one unique identification code associated with the first tapping valve $V_1$ through the first unique recognition element With reference to step D, a data concerning said at least one first unique identification code is stored in said storage means SM.

Consequently, since in the example being described the first unique recognition element is a first QR code, said at least one first unique identification code is contained in said first QR code and a data concerning said at least one first unique identification code is stored in said storage means SM.

With reference to step E, the method provides the step of acquiring at least a second unique identification code associated with the second tapping valve $V_2$ through the second unique recognition element $C_2$.

With reference to step F, a data concerning said at least a second unique identification code is stored in said storage means SM.

Consequently, since in the example being described the second unique recognition element is a second QR code, said at least one second unique identification code is contained in said second QR code and a data concerning said at least one second unique identification code is stored in said storage means SM.

With reference to step G, a first beverage $B_1$ is selected between the plurality of beverages $B_1, B_2 \ldots B_J$ mentioned above.

With reference to step H, said first beverage $B_1$ is associated with the first tapping valve $V_1$ and a data concerning said first beverage $B_1$ associated with said first tapping valve $V_1$ is stored in said storage means SM.

With reference to step I, a second beverage $B_2$ is selected between the plurality of beverages $B_1, B_2 \ldots B_J$ mentioned above.

With reference to step L, said second beverage $B_2$ is associated with the second tapping valve $V_2$ and a data concerning said second beverage $B_2$ associated with said second tapping valve $V_2$ is stored in said storage means SM.

Said second beverage $B_2$ can be equal to or different from the first beverage $B_1$.

With reference to step M, a digital twin of said beverage dispenser D is created through a data group stored in said storage means SM.

In particular, said data group comprises:
a data concerning said selected geographical area $A_1, A_2 \ldots A_N$ and/or a data concerning said selected site $S_{11}, S_{12} \ldots S_{1M}, S_{21}, S_{22} \ldots S_{2M}, S_{N1}, S_{N2} \ldots S_{NM}$,
a data concerning said at least one a first unique identification code associated with said first tapping valve
a data concerning said at least one second unique identification code associated with said second tapping valve $V_2$,
a data concerning said first beverage $B_1$ associated with said first tapping valve $V_1$, and a data concerning said second beverage $B_2$ associated with said second tapping valve $V_2$.

Furthermore, the step C comprises the following sub-step:

C1) storing in said storage means SM a number equal to the total number of tapping valves included in said beverage dispenser D. wherein If the step C of the method comprises the sub-step C1, the data group mentioned in step M can comprise said total number of tapping valves.

With reference to step A, a plurality of sets of parameters are stored in said storage means SM.

Said plurality of sets of parameters comprises at least one first set of parameters associated with the first beverage $B_1$ comprising one or more parameters, and a second set of parameters associated with the second beverage $B_2$ comprises one or more parameters.

With reference to step G of the method, said step G can comprise the sub-step of selecting said first set of parameters associated with the first beverage $B_1$, and with reference to step I of the method, said step I can comprise the sub-step of selecting said second set of parameters associated with the second beverage $B_2$.

Furthermore, said method can comprise the following steps: modifying one or more parameters of said first set of parameters stored in said storage means SM, so that said one or more modified parameters of said first set of parameters are stored in said storage means SM, and/or modifying one or more parameters of said second set of parameters stored in said storage means SM, so that said one or more modified parameters of said second set of parameters are stored in said storage means SM.

In an example, an operator can remotely modify one or more parameters of the first set of parameters stored in said storage means SM of the cloud server SC and/or one or more parameters of the second set of parameters SM stored in said second storage means SM of the cloud server SC.

Each modified parameter of the first set of parameter associated with the first beverage $B_1$ and/or each modified parameter of the second set of parameters $B_2$ is stored in said storage means SM of the cloud server SC.

Consequently, each parameter (of the first set of parameters and/or of the second set of parameters) initially stored in the cloud server SC is replaced by the respective modified parameter.

With reference to step M, the data group can comprise said one or more modified parameters of the first set of parameters and/or said one or more modified parameters of the second set of parameters.

However, the modification of said one or more parameters of the first set of parameters and/or of said one or more parameters of the second set of parameters can take place in automatic mode.

Said cloud server SC can comprise a logic control unit U connected to said storage means SM and configured to:

modify said one or more parameters of said first set of parameters, and/or modify said one or more parameters of said second set of parameters.

For example said logic control unit U can be configured to periodically modify one or more parameters of the first set of parameters and/or one or more parameters of the first set of parameters.

Furthermore, the logic control unit U of the cloud server SC can be configured to:

send said one or more modified parameters of said first set of parameters to said first tapping valve ($V_1$).

Said first tapping valve $V_1$ can comprise:

first storage means $SM_1$ wherein said first set of parameters associated with the first beverage $B_1$ is stored, and a first logic control unit $U_1$ connected to said first storage means $SM_1$ and configured to:

receive said one or more modified parameters of said first set of parameters sent by the logic control unit U of said cloud server SC, and store in said first storage means $SM_1$ said one or more modified parameters of said first set of parameters.

Furthermore, said logic control unit U of said cloud server (SC) is configured to:

send one or more modified parameters of said second set of parameters to said second tapping valve $V_2$.

Said second tapping valve $V_2$ can comprise:

second storage means $SM_2$ wherein said second set of parameters associated with the second beverage $B_2$ is stored, and a second logic control unit $U_2$, connected to said second storage means $SM_2$ and configured to:

receive said one or more modified parameters of said second set of parameters sent by the logic control unit U of said cloud server SC, and store in said second storage means $SM_2$ said one or more modified parameters of said second set of parameters.

Although not shown in Figures, the first tapping valve $V_1$ comprise a first receiving module for receiving signals from said cloud server SC, preferably a first transceiver module for sending/receiving signals to/from said cloud server SC, and the second tapping valve $V_2$ comprises a second receiving module for receiving signals from said cloud server SC, preferably a second transceiver module for sending/receiving signals to/from said cloud server SC.

Each modified parameter of the first set of parameters associated with the first beverage $B_1$ and/or each modified parameter of the second set of parameters $B_2$ is stored in said storage means SM of the cloud server SC.

Each parameter of the first set of parameters initially stored in the first tapping valve $V_1$ is replaced by the respective modified set of parameters by the cloud server SC.

Each parameter of the second set of parameters initially stored in the second tapping valve $V_2$ is replaced by the respective modified parameter sent by the cloud server SC.

In an alternative, the parameter values of the first set of parameters and/or the parameter values of the second set of parameters can be changed in the respective storage means of the respective tapping valves and sent to the cloud server SC.

Hence, a first set of parameters can be stored in said first storage means $SM_1$ and the method can comprise the following steps:

modifying one or more parameters of said first set of parameters stored in said first storage means $SM_1$ through said first logic control unit $U_1$, so that one or more modified parameters of said first set of parameters are stored in said first storage means $SM_1$, sending to said cloud server SC, through said first logic control unit $U_1$, said one or more modified parameters of said first set of parameters, receiving from said cloud server SC said one or more modified parameters of said first set of parameters sent by said first logic control unit $U_1$, storing in said storage means SM of said cloud server SC said one or more modified parameters of said first set of parameters, through said logic control unit U.

In addition or as an alternative to the possibility of modifying the values of one or more parameters of the first set of parameters stored in the first tapping valve $V_1$ and sending said modified parameters to the cloud server SC, a second set of parameters associated with the second beverage $B_2$ can be stored in said second storage means $SM_2$ and the method can comprise the following steps:

- modifying one or more parameters of said second set of parameters stored in said second storage means $SM_2$ through said second logic control unit $U_2$, so that said one or more modified parameters of said second set of parameters are stored in said second storage means $SM_2$,
- sending to said cloud server SC, through said second logic control unit $U_2$, said one or more modified parameters of said second set of parameters,
- receiving from said cloud server SC said one or more modified parameters of said second set of parameters sent by said second logic control unit $U_2$,
- storing in said storage means SM of said cloud server SC said one or more modified parameters of said second set of parameters, through said logic control unit U.

In other words, an operator can modify (remotely or on site) the values of one or more parameters of the first set of parameters associated with the first tapping valve $V_1$ and/or the values of one or more parameters of the second set of parameters associated with the second tapping valve $V_2$.

The modified values of the parameters of the first set of parameters and/of the second set of parameters are then sent to the cloud server SC which stores them.

Although not shown in Figures, the first tapping valve $V_1$ comprises a first transmitting module for sending signals to said cloud server SC, preferably a first transceiver module for sending/receiving signals to/from said cloud server SC, and the second tapping valve $V_2$ comprises a second transmitting module for sending signals to said cloud server SC, preferably a second transceiver module for sending/receiving to/from said cloud server SC.

With reference to said one or more parameters of the first set of parameters associated with the first beverage $B_1$, said one or more parameters of the first set of parameters can be selected from the following parameters: a numerical value associated with a quantity of a first liquid, wherein said first liquid is water or soda, a numerical value associated with a quantity of a second liquid, wherein said second liquid is syrup, a numerical value associated with a ratio between said quantity of said first liquid and said quantity of said second liquid, a numerical value associated with a first flow rate of said first beverage $B_1$.

With reference to said one or more parameters of the second set of parameters associated with the second beverage $B_2$, said one or more parameters of the second set of parameters can be selected from the following parameters: a numerical value associated with a quantity of a further first liquid, wherein said further first liquid is water or soda, a numerical value associated with a quantity of a further second liquid, wherein said further second liquid is syrup, a numerical value associated with a ratio between said quantity of said further first liquid and said quantity of said further second liquid, a numerical value associated with a second flow rate of said second beverage $B_2$.

Furthermore, the method can comprise the following steps:

- associating an unique recognition element $C_D$ to said beverage dispenser D,
- acquiring at least one unique identification code associated with said beverage dispenser D through said unique recognition element $C_D$; and
- storing in said storage means SM a data concerning said at least one unique identification code.

Said unique recognition element $C_D$ can be a QR code or a RFID tag.

In the example being disclosed, said unique recognition element $C_D$ is a QR code.

Advantageously, embodiments of the present disclosure allow an operator to remotely control one or more tapping valves of a beverage dispenser through the digital twin of said beverage dispenser.

In this way, any action performed by the operator towards the digital twin is reflected in an action towards the beverage dispenser.

In one example, if the operator changes the value of a parameter of a set of parameters associated with a tapping valve of a digital twin of a beverage dispenser, the value of the corresponding parameter of the set of parameters associated with the tapping valve of the beverage dispenser will be changed.

In a further example, if the operator adds a parameter to a set of parameters associated with a tapping valve of a digital twin of a beverage dispenser, the set of parameters associated with the tapping valve of the beverage dispenser will include said additional parameter.

The present disclosure has been described for illustrative, but not limitative purposes, according to its preferred embodiments, but it is to be understood that variations and/or modifications can be carried out by a skilled in the art, without departing from the scope thereof, as defined according to enclosed claims.

What is claimed is:

1. A method for creating a digital twin of a beverage dispenser, wherein said beverage dispenser comprises at least one first tapping valve and a second tapping valve, wherein a first unique recognition element is associated with said first tapping valve and a second unique recognition element is associated with said second tapping valve, said method comprising:

A) providing a communication network comprising a cloud server provided with a storage wherein following data are stored:
   - one or more geographical areas,
   - for each geographical area one or more respective sites in which at least a beverage dispenser is placed, and
   - a plurality of beverages, different from each other;

B) selecting:
   - a geographical area between the geographical areas stored in said storage and/or a site between the sites stored in said storage associated with the selected geographical, and
   - storing in said storage a data concerning said selected geographical area and/or a data concerning said selected site;

C) acquiring at least one first unique identification code associated with said first tapping valve through said first unique recognition element;

D) storing in said storage a data concerning said at least one first unique identification code;

E) acquiring at least one second unique identification code associated with said second tapping valve through said second unique recognition element;

F) storing in said storage a data concerning said at least one second unique identification code;

G) selecting a first beverage between said plurality of beverages;

H) associating said first beverage with said first tapping valve and storing in said storage a data concerning said first beverage associated with said first tapping valve;

I) selecting a second beverage between said plurality of beverages;

L) associating said second beverage with said second tapping valve and storing in said storage a data concerning said second beverage associated with said second tapping valve; and M) creating a digital twin of said beverage dispenser through a data group stored in said storage, wherein said data group comprises:
- a data concerning said selected geographical area and/or a data concerning said selected site,
- a data concerning said at least one a first unique identification code associated with said first tapping valve,
- a data concerning said at least one second unique identification code associated with said second tapping valve,
- a data concerning said first beverage associated with said first tapping valve, and
- a data concerning said second beverage associated with said second tapping valve.

2. The method according to claim 1, wherein the step C comprises a following sub-step:
C1) storing in said storage a number equal to a total number of tapping valves included in said beverage dispenser,
wherein with reference to the step M, said data group comprises said total number of tapping valves.

3. The method according to claim 1, wherein:
with reference to the step A, a plurality of sets of parameters is stored in said storage, wherein said plurality of sets of parameters comprises at least one first set of parameters associated with the first beverage comprising one or more parameters, and a second set of parameters associated with the second beverage comprising one or more parameters.

4. The method according to claim 3, wherein said step G comprises a following sub-step:
selecting said first set of parameters associated with the first beverage, said step I comprises a following sub-step:
selecting said second set of parameters associated with the second beverage,
wherein said method comprises following steps:
modifying one or more parameters of said first set of parameters stored in said storage, so that said one or more modified parameters of said first set of parameters are stored in said storage,
and/or
modifying one or more parameters of said second set of parameters stored in said storage, so that said one or more modified parameters of said second set of parameters are stored in said storage,
wherein with reference to the step M, said data group comprises said one or more modified parameters of said first set of parameters and/or said one or more modified parameters of said second set of parameters.

5. The method according to claim 4, wherein said cloud server comprises a logic control unit connected to said storage and configured to:
modify said one or more parameters of said first set of parameters and/or modify said one or more parameters of said second set of parameters.

6. The method according to the claim according to claim 5, wherein:
said logic control unit of said cloud server is configured to:
send said one or more modified parameters of said first set of parameters to said first tapping valve, and
wherein said first tapping valve comprises:
a first storage wherein said first set of parameters associated with the first beverage is stored, and
a first logic control unit configured to:
receive said one or more modified parameters of said first set of parameters sent by the logic control unit of said cloud server, and
store in said first storage said one or more modified parameters of said first set of parameters,
and/or
said logic control unit of said cloud server is configured to:
send one or more modified parameters of said second set of parameters to said second tapping valve,
wherein said second tapping valve comprises:
a second storage wherein said second set of parameters associated with the second beverage is stored, and
a second logic control unit connected to said second storage and configured to:
receive said one or more modified parameters of said second set of parameters sent by the logic control unit of said cloud server, and
store in said second storage said one or more modified parameters of said second set of parameters.

7. The method according to claim 3, wherein said first tapping valve comprises:
a first storage configured to store said first set of parameters associated with the first beverage, and
a first logic control unit connected to said first storage,
wherein said method comprises the following steps:
modifying one or more parameters of said first set of parameters stored in said first storage through said first logic control unit, so that one or more modified parameters of said first set of parameters are stored in said first storage,
sending to said cloud server, through said first logic control unit, said one or more modified parameters of said first set of parameters,
receiving from said cloud server said one or more modified parameters of said first set of parameters sent by said first logic control unit,
storing in said storage of said cloud server said one or more modified parameters of said first set of parameters, through said logic control unit, and/or
said second tapping valve comprises:
a second storage wherein said second set of parameters associated with the second beverage is stored, and
a second logic control unit connected to said second storage,
wherein said method comprises the following steps:
modifying one or more parameters of said second set of parameters stored in said second storage through said second logic control unit, so that said one or more modified parameters of said second set of parameters are stored in said second storage,
sending to said cloud server, through said second logic control unit, said one or more modified parameters of said second set of parameters, and receiving from said cloud server said one or more modified parameters of said second set of parameters sent by said second logic control unit, storing in said storage of said cloud server said one or more modified parameters of said second set of parameters, through said logic control unit.

8. The method according to claim 3, wherein:

said one or more parameters of said first set of parameters associated to the first beverage are chosen between following parameters: a numerical value associated with a quantity of a first liquid, in which said first liquid is water or soda, a numerical value associated with a quantity of a second liquid, in which said second liquid is a syrup, a numerical value associated with a ratio between said quantity of said first liquid and said quantity of said second liquid, a numerical value associated with a first flow rate of said first beverage, said one or more parameters of said second set of parameters associated with the second beverage are chosen between the following parameters: a numerical value associated with a quantity of a further first liquid, in which said further first liquid is water or soda, a numerical value associated with a quantity of a further second liquid, in which said further second liquid is a syrup, a numerical value associated with a ratio between said quantity of said further first liquid and said quantity of said further second liquid, a numerical value associated with a second flow rate of said second beverage.

9. The method according to claim 1, wherein said first unique recognition element is a first QR code, and said second unique recognition element is a second QR code.

10. The method according to claim 1, wherein said first unique recognition element is a first RFID tag, and said second unique recognition element is a second RFID tag.

11. The method according to claim 1, wherein said method comprises following steps:

associating an unique recognition element to said beverage dispenser, acquiring at least one unique identification code associated with said beverage dispenser through said unique recognition element; and storing in said storage a data concerning said at least one unique identification code.

12. The method according to claim 11, wherein said unique recognition element is a QR code or a RFID tag.

13. The method according to claim 1, wherein said second beverage is equal to or different from said first beverage.

* * * * *